United States Patent
Chino et al.

[11] Patent Number: 6,124,210
[45] Date of Patent: Sep. 26, 2000

[54] METHOD OF CLEANING SURFACE OF SUBSTRATE AND METHOD OF MANUFACTURING SEMICONDUCTOR DEVICE

[75] Inventors: Hiroshi Chino; Setsu Suzuki; Hideya Matsumoto; Shoji Ohgawara, all of Tokyo, Japan

[73] Assignees: Canon Sales Co., Inc.; Semiconductor Process Laboratory Co., Ltd., both of Japan

[21] Appl. No.: 09/317,163

[22] Filed: May 24, 1999

[30] Foreign Application Priority Data

Mar. 5, 1999 [JP] Japan .................................. 11-058547

[51] Int. Cl.⁷ ...................... H01L 21/322; H01L 21/302; H01L 21/31
[52] U.S. Cl. .......................... 438/706; 438/477; 438/759; 438/770; 438/974; 438/906; 134/1.3
[58] Field of Search ..................................... 438/477, 690, 438/706, 765, 759, 758, 800, 770, 906, 974; 134/1.3, 1.2

[56] References Cited

U.S. PATENT DOCUMENTS

| | | | |
|---|---|---|---|
| 5,674,357 | 10/1997 | Sun et al. ........................... | 156/659.11 |
| 5,749,975 | 5/1998 | Li et al. .................................. | 134/1.3 |
| 5,782,986 | 7/1998 | Butterbaugh et al. .................... | 134/1.3 |
| 5,994,240 | 11/1999 | Thakur ................................... | 438/758 |

FOREIGN PATENT DOCUMENTS

| | | |
|---|---|---|
| 63-228620 | 9/1988 | Japan . |
| 2-105416 | 4/1990 | Japan . |
| 4-151831 | 5/1992 | Japan . |
| 4-167431 | 6/1992 | Japan . |

*Primary Examiner*—Charles Bowers
*Assistant Examiner*—Hsien-Ming Lee
*Attorney, Agent, or Firm*—Lorusso & Loud

[57] ABSTRACT

The present invention relates to a method of cleaning a surface of a substrate employed prior to film formation by using the CVD method which uses a reaction gas containing an ozone containing gas which contains ozone ($O_3$) in oxygen ($O_2$) and tetraethylorthosilicate (TEOS). The substrate surface cleaning method comprises the steps of oxidizing particles 13 by contacting a pre-process gas containing ozone 15 to a surface 12 of a substrate 11 on which the particles 13 are present, and removing the particles 13 by heating the substrate 11 to exceed a decomposition point of oxide 13a of the particles 13.

12 Claims, 4 Drawing Sheets

METHOD OF CLEANING SURFACE OF SUBSTRATE AND METHOD OF MANUFACTURING SEMICONDUCTOR DEVICE

BACKGROUND OF THE INVENTION

1. Field of the Invention

The present invention relates to a method of cleaning a substrate surface employed prior to film formation by using the CVD (Chemical Vapor Deposition) method which uses a reaction gas (hereinafter referred to as an "$O_3$/TEOS reaction gas") containing an ozone containing gas which contains ozone ($O_3$) in oxygen ($O_2$) and tetraethylorthosilicate (TEOS), and a method of manufacturing a semiconductor device using the above method.

2. Description of the Prior Art

In recent years, an insulating film can be formed by the CVD method using the $O_3$/TEOS reaction gas (hereinafter referred to as an "$O_3$/TEOS-CVDSiO$_2$ film"). The insulating film has fine quality and a smaller etching rate, is not shrunk in the high temperature heating process, has less moisture content, and has better flow performance as the $O_3$ concentration in $O_2$ becomes higher. Where a silicon oxide film which is formed by using the $O_3$/TEOS reaction gas containing the high concentration $O_3$ (called a "High $O_3$/TEOS reaction gas" hereinafter) is called a High $O_3$/TEOS-CVDSiO$_2$ film, and the $O_3$/TEOS reaction gas containing the low concentration $O_3$ is called a "Low $O_3$/TEOS reaction gas.

Meanwhile, in the case that the High $O_3$/TEOS reaction gas is employed, a degree of influence of the film formation upon surface conditions of a film-forming surface (referred to as "surface dependency" hereinafter) is increased. Where the film forming surface corresponds to a surface of a substrate on which a film is planed to be formed. More particularly, it has been known that, if as shown in FIG. 1A, a particular extraneous substance, i.e., an particle 3 are present on a film-forming surface 2 of a substrate 1, such particle 3 is melted down at the film forming temperature to spread over (such area is indicated by a reference 3b), as shown in FIG. 1B, and then a deposition rate of the High $O_3$/TEOS-CVDSiO$_2$ film 4 is extremely lowered in a range of several tens μm to several mm in diameter around the almost circular area, otherwise the High $O_3$/TEOS-CVDSiO$_2$ film 4 is not deposited at all in the same range, as shown in FIG. 1C. This abnormal film forming phenomenon is often called a circular defect, a spot fault, or the like.

In the prior art, prior to the formation of the $O_3$/TEOS-CVDSiO$_2$ film, these extraneous particles are removed by cleaning the substrate by the wet cleaning in the pure water. FIG. 2 is a flowchart showing the film forming steps containing the pre-processing step according to the prior art.

The circumstances in the clean room which is prepared to manufacture the semiconductor device can be kept clean since floating particles are small in number. Nevertheless, since the particles are produced due to the human being such as the operator in many cases, such particles are often detected from an inside of the clean room. Accordingly, even if the substrate 1 is cleaned previously by the wet cleaning, there is a high possibility that such particles are stuck to the substrate 1 again in the clean room. As a result, it has been difficult to remove the foregoing circular defect in the prior art.

SUMMARY OF THE INVENTION

The present invention has been made in view of above problem in the prior art and it is an object of the present invention to provide a substrate surface cleaning method which is employed prior to film formation and is capable of suppressing generation of defective film formation in forming an $O_3$/TEOS-CVDSiO$_2$ film, particularly a high $O_3$/TEOS-CVDSiO$_2$ film, and a semiconductor device manufacturing method using this substrate surface cleaning method.

A gist of the present invention will be explained hereunder.

According to the examination made by the inventors of the present invention, it has been found that the defective film formation generated in forming the $O_3$/TEOS-CVDSiO$_2$ film, especially the High $O_3$/TEOS-CVDSiO$_2$ film is caused by alkaline metal salt such as sodium (Na) or potassium (K), and chlorine (Cl), contained in the particles. In other words, it may be supposed that the existence of such particles results in generating sodium chlorate or potassium chlorate through the particles' being oxidized by the ozone in the film forming gas, and then such sodium chlorate or potassium chlorate is melted at the film forming temperature to then spread over the surface of the wafer, and as a result the film forming defect is caused over the broad range.

By the way, it has been known that these sodium chlorate or potassium chlorate are dissociated at the temperature of 482° C. and 400° C. respectively.

Based on the above-mentioned examination results, the inventors of the present invention have concluded as follows. That is, in the event that the particles formed of the alkaline metal salt are stuck onto the surface of the wafer, before the film formation is commenced, the particles are oxidized by supplying an oxidizing pre-process gas to the surface of the wafer for a predetermined time and then the wafer temperature is kept at the temperature in excess of the decomposition point of the oxidized particle, whereby the particles can be effectively removed from the surface of the wafer due to the dissociation and thus the surface of the wafer can be cleaned. In this case, the ozone which has a very strong oxidizing force is effective for the oxidizing gas contained in the preprocess gas. Where the term "decomposition" employed in the above signifies that the oxide of the particles is separated into constituent elements, and is substantially equal to the term "dissociation".

Even if the film is formed on the surface of the substrate by the chemical vapor deposition while using the film forming gas which contains the ozone containing gas and the silicon containing gas, e.g., the film forming gas like a gas mixture consisting of a gas containing ozone in the oxygen and a gas containing TEOS, which is affected strongly by the surface dependency in the film formation, the actual cleaning in this way deletes such surface dependency in forming the film to thus lead to a normal deposition of the silicon containing insulating film.

DESCRIPTION OF THE PREFERRED EMBODIMENT

An embodiment of the present invention will be explained with reference to the accompanying drawings hereinafter.

(Examination result to yield the present invention)

The inventors of the present invention have examined details of the abnormal film forming area caused in forming the $O_3$/TEOS-CVDSiO$_2$ film, particularly the High $O_3$/TEOS-CVDSiO$_2$ film, and have accomplished the results described in the following.

Figure 1A:
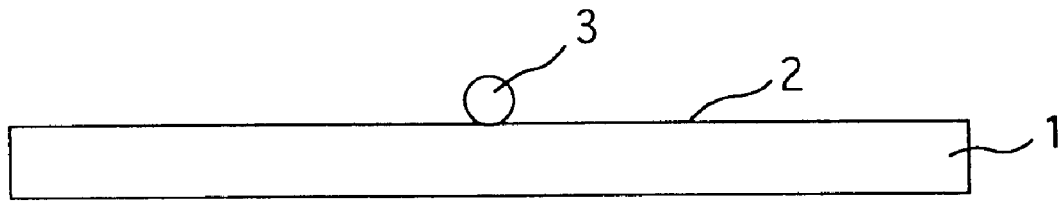
FIGS. 1A to 1C are sectional views showing semiconductor device manufacturing steps indicating the problem in the prior art.
Figure 1B:
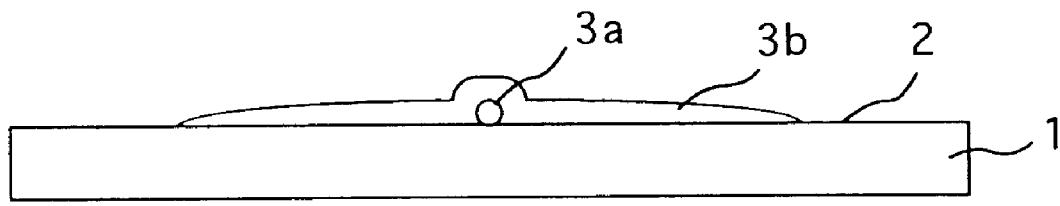
Figure 1C:
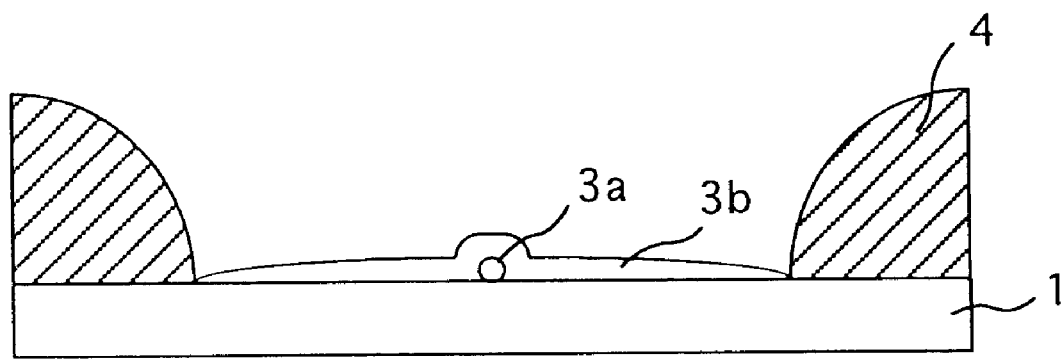
Figure 2:
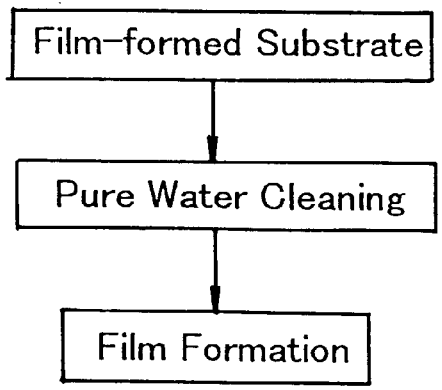
FIG. 2 is a flowchart showing an improved semiconductor device manufacturing method in the prior art in the order of steps.

That is to say, a minute particle 3$a$ has been observed in the center area of the abnormal film forming area shown in FIG. 1C. Constituent elements of alkaline metal salt such as Na or K, and Cl have been detected by analyzing components of this minute particle 3$a$.

According to the reproducing examination conducted to confirm the above phenomenon, it has been found that, if the alkaline metal salt such as KCl, KClO$_3$, etc. is spread over a Si wafer, a large number of circular defects are generated after the High $O_3$/TEOS-CVDSiO$_2$ film is formed.

For example, NaCl and KCl as the representative alkaline metal salts have a melting point of 801° C. and 770° C. respectively, and thus they are chemically stable at the temperature of less than 660° C. as the film forming temperature. However, when the alkaline metal salts are oxidized by a strong oxidizing force of $O_3$ contained in the $O_3$/TEOS reaction gas to be changed into alkaline metal chlorate salts such as sodium chlorate (NaClO$_3$), potassium chlorate (KClO$_3$), etc., their melting points are reduced to 261° C. and 356° C. respectively.

In this manner, if the alkaline metal chlorate salt is formed on the surface of the wafer, it is melted on the surface of the wafer which is kept at the film forming temperature higher than its melting temperature and then spread over the surface of the wafer. Since the film formation of the $O_3$/TEOS-CVDSiO$_2$ film is extremely disturbed because of surface contamination in the broad range, the film forming defect is detected in a circular profile which is close to a substantially true circle.

It has been known that above NaClO$_3$ and KClO$_3$ impede the film formation since they melt down near the film forming temperature, while above NaClO$_3$ and KClO$_3$ are dissociated at the temperature of 482° C. and 400° C. respectively. Thermal properties of KCl, KClO$_3$, and NaCl, NaClO$_3$ are given in Table 1 as follows.

TABLE 1

Thermal stability of KCl, KClO$_3$, and NaCl, NaClO$_3$

| Material | Melting Point | Boiling Point | Dissociation Temp. |
|---|---|---|---|
| KCl | 770° C. | 1500° C. (sublimation) | |
| KClO$_3$ | 356° C. | boiling point decomposition | 400° C. |
| NaCl | 801° C. | 1413° C. | |
| NaClO$_3$ | 261° C. | boiling point decomposition | 482° C. |

Based on the above-mentioned examination results, the following conclusion can be supposed. That is, in the event that the particles formed of the alkaline metal salt are stuck to the surface of the wafer (film-formed substrate or substrate), before the film formation is commenced by supplying the $O_3$/TEOS reaction gas to the surface of the wafer, the particles are oxidized by supplying a pre-process gas containing $O_3$, e.g., an oxidizing gas mixture consisting of $O_2$ containing $O_3$ and $N_2$, to the surface of the wafer for a predetermined time and then the wafer temperature is kept at the temperature in excess of the decomposition point of the oxidized particle, whereby the particles can be removed effectively from the surface of the wafer due to the dissociation and thus the surface of the wafer can be cleaned.

Even if the film is formed on the surface (film-forming surface) of the substrate by the chemical vapor deposition while using the film forming gas which is affected strongly by the surface dependency, the actual cleaning in this way deletes such surface dependency in forming the film to thus lead to a proper deposition of the silicon containing insulating film. In this case, the film forming gas which contains the ozone containing gas and the silicon containing gas, e.g., the film forming gas like a gas mixture consisting of a gas containing ozone in the oxygen and a gas containing TEOS, may be employed.

(Embodiment)

Figure 3A:
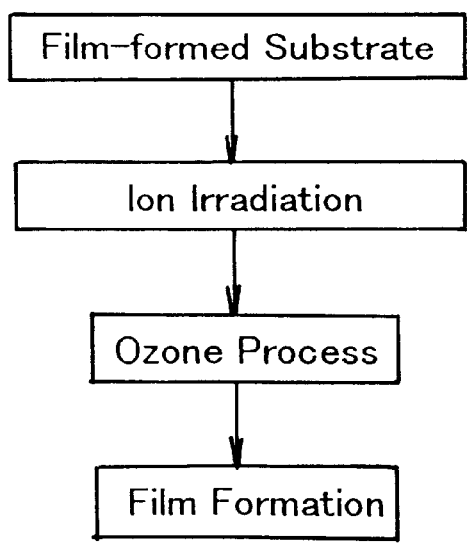
FIG. 3A is a flowchart showing a semiconductor device manufacturing method using a film-forming surface cleaning method according to an embodiment of the present invention.
Figure 4A:
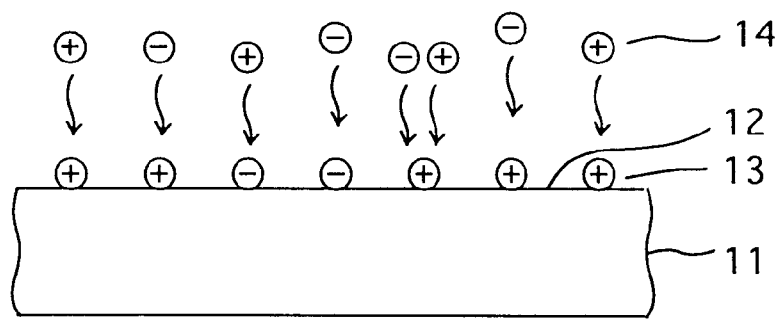
Figure 4B:
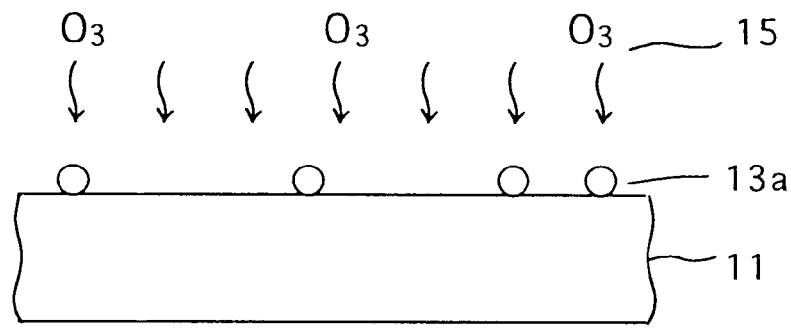
Figure 4C:
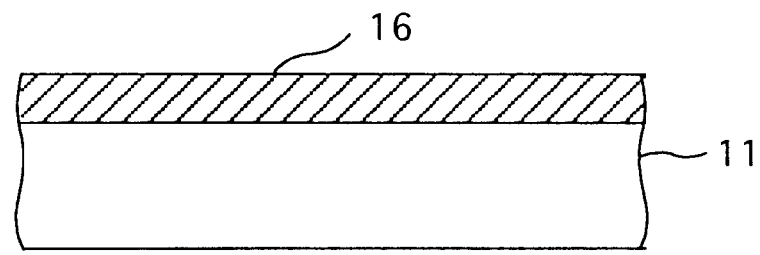
Figure 5:
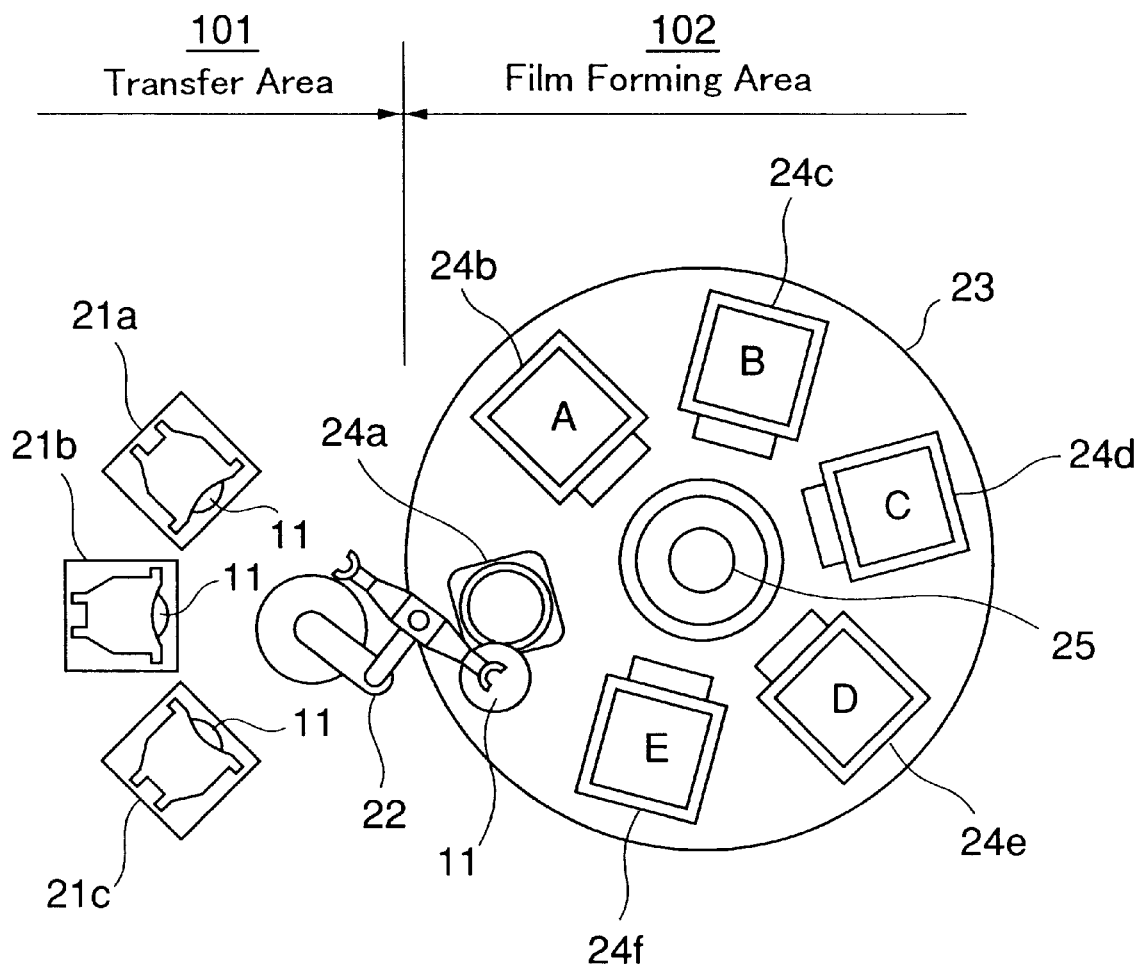

FIG. 3A is a flowchart showing a method of forming a film on a semiconductor substrate including a film-forming surface cleaning method according to an embodiment of the present invention. FIGS. 4A to 4C are sectional views showing the film-forming surface cleaning method according to the embodiment of the present invention in the order of steps. FIG. 5 is a top view showing a film forming equipment employed to carry out the film-forming surface cleaning method according to the embodiment of the present invention.

To begin with, the film forming equipment employed to carry out the film-forming surface cleaning method according to the embodiment of the present invention will be explained with reference to FIG. 5 hereunder.

As shown in FIG. 5, the film forming equipment comprises a transfer area 101 for a wafer (film-formed substrate or substrate), and a film forming area 102 for the wafer.

Wafer cassettes 21$a$ to 21$c$ in which the wafers are stored before or after film formation are provided to the transfer area 101. A transfer robot 22 is also provided to the transfer area 101. The transfer robot 22 transfers the wafers 26 from the wafer cassettes 21$a$ to 21$c$ to the film forming area 102 before the film formation, and conversely transfers the wafers 26 from the film forming area 102 to the wafer cassettes 21$a$ to 21$c$ after the film formation. In addition, a discharge ionizer (not shown) is provided to the transfer area 101. The electrostatically charged film-forming surface of the wafer 26 can be discharged in the middle of transfer by generating positive and negative ions from the discharge ionizer. In this case, if the particles are stuck onto the film-forming surface, the electrostatic charges on such particles can be eliminated simultaneously.

A circular-disk type wafer loading table 23 which is equipped with a plurality of wafer loading portions 24a to 24f is provided to the film forming area 102. The wafer loading table 23 is fixed. Also, a rotation axis 25 of a transfer arm is provided to the center area of the wafer loading table 23.

Six wafer loading portions 24a to 24f are provided on the circular-disk type wafer loading table 23 along the circumference around the rotation axis 25 of the transfer arm. The six wafer loading portions 24a to 24f are provided respectively to carry out separate operations independently. The wafer loading portion 24a located in the direct neighborhood of the transfer robot 22 acts as a wafer transfer portion where the wafer is temporarily held for transferring to next portion, and one film-forming surface cleaning portion (A portion) 24b and four film forming portions (B to E portions) 24c to 24f are provided clockwise in sequence along the circumference.

The wafer transfer portion 24a receives the wafer 26 from the transfer robot 22 prior to the film formation and then transfers the wafer 26 to the transfer robot 22 after the film formation. In this case, a heating means for heating the wafer preliminarily may be provided such that the cleaning process before the film formation can be immediately carried out.

The film-forming surface cleaning portion (A portion) 24b executes the cleaning process of the film-forming surface of the wafer by using the oxygen gas containing ozone ($O_3$). For this purpose, the film-forming surface cleaning portion (A portion) 24b has a discharge port for the oxygen gas containing the ozone ($O_3$), and a wafer heating means for heating the wafer during the cleaning process.

In the wafer loading portions (B to E portions) 24c to 24f, the film is formed on the film-forming surface of the wafer by using the $O_3$/TEOS reaction gas. For this purpose, a discharge port (or discharge ports) for the reaction gas is (or are) provided to each of the wafer loading portions 24c to 24f. In this case, as the discharge port(s) for the reaction gas, either independent discharge port(s) which introduce the $O_2$ gas containing $O_3$ and the TEOS gas separately into the wafer loading portions 24c to 24f or one integrated discharge port which discharges the $O_2$ gas containing $O_3$ and the TEOS gas as the gas mixture may be employed. In addition, each of the wafer loading portions 24c to 24f has a heating means which causes thermal reaction of the reaction gas.

The transfer arm (not shown) is then provided to the rotation axis 25 located at the center portion of the circular-disk type wafer loading table 223. The transfer arm has a vacuum chuck or an electrostatic chuck, and can be rotated clockwise, for example, around the rotation axis 25. The transfer arm holds the wafer bag the vacuum chuck, or the like and then transfers the wafer from one of the wafer loading portions 24c to 24f to the other of the wafer loading portions 24c to 24f sequentially.

Next, a film-forming surface cleaning method using the above film-forming equipment and a semiconductor device manufacturing method using this cleaning method will be explained with reference to FIG. 3A, FIGS. 4A to 4C, and FIG. 5 hereunder.

First, the wafers 11 formed of silicon and contained in the wafer cassettes 21a to 21c in the transfer area 101 of the film-forming equipment in FIG. 5 are transferred to the film forming area 102 by using the transfer robot 22. In this case, assume that a film-forming surface 12 is composed of a silicon surface and the particles 13 consisting of charged alkaline metal salt are stuck onto the film-forming surface 12.

At this time, as shown in FIG. 4A, positive and negative ions 14 are generated from the discharge ionizer. The film-forming surface 12 of the wafer 11 and the particles 13, which are electrostatically charged, can be neutralized by the positive and negative ions 14. Thus, electrostatic sticking of additional particles onto the wafer 11 can be prevented, and also the particles 12 which have already stuck onto the surface of the wafer 11 can be easily removed from the surface of the wafer 11 physically.

The transfer robot 22 then loads the wafer 11 on the wafer transfer portion 24a on the wafer loading table 23 provided in the film forming area 102.

The wafer 11 loaded on the wafer :ransfer portion 24a is transferred to the next film-forming surface cleaning portion (A portion) 24b by the transfer arm. While, the transfer robot 22 installed in the transfer area 101 takes out the next wafer 11 from the wafer cassettes 21a to 21c, then transfers the wafer 11 to the film forming area 102 via the transfer area 101, and then loads the wafer 11 onto the wafer transfer portion 24a.

The film-forming surface cleaning portion (A portion) 24b for the wafer 11 supplies the preprocess gas 15 containing $O_3$, e.g., an oxidizing gas mixture consisting of the $O_2$ gas containing $O_3$ and the $N_2$ gas, to the film-forming surface 12 of the wafer 11 for the predetermined period of time. Therefore, as shown in FIG. 4B, the particles 13 being stuck onto the surface of the wafer 11 are oxidized. At the same time, the wafer 11 is heated up to the decomposition point or more of the particle oxide 13a, preferably about 400° C. or more, and then kept at that temperature. As a result, the particles 13 can be escaped effectively from the surface of the wafer 11 due to the dissociation and thus the surface of the wafer 11 can be cleaned. Conditions of the pre-process are given in Table 2 (the item of the cleaning portion A). 0 g/$Nm^3$ set forth in the item of $O_3$ concentration indicates that the pre-process is applied to the case where an unprocessed sample is prepared. In this case, in g/$Nm^3$, 'N' denotes abbreviation of 'normal' which is the measuring conditions of the temperature of 0° C. and the atmospheric pressure of 1, and denotes the density at the temperature of 0° C. and the atmospheric pressure of 1 in overall unit g/$Nm^3$.

TABLE 2

| | Process Conditions | |
|---|---|---|
| Item | Cleaning portion A | Film forming portions B, C, D, E |
| Wafer temperature | 500° C. | 500° C. |
| $O_2$ flow rate | 7.5 slm | 7.5 slm |
| $N_2$ flow rate | 23.0 slm | 23.0 slm |
| TEOS flow rate | 0 slm | 5.125 slm |
| $O_3$ concentration | 0 or 100 g/$Nm^3$ | 140 g/$Nm^3$ |

The wafer 11 whose film-forming surface 12 has been cleaned is then transferred to the wafer loading portions 24c to 24f acting as the next film forming portions (B to E portions) by the transfer robot, and also the wafer 11 positioned on the wafer transfer portion 24a is transferred to the film-forming surface cleaning portion (A portion) 24b. Also, the new wafer 11 is transferred from one of the wafer cassettes 21a to 21c to the wafer transfer portion 24a. The film-forming surface of the wafer 11, when transferred to the film-forming surface cleaning portion (A portion) 24b, is cleaned there.

Four sheets of wafers 11 which are electrostatically discharged by repeating the above steps are loaded on four film forming portions (B to E portions) respectively.

The film forming gas like the gas mixture consisting of the gas containing the ozone in the oxygen and the gas containing TEOS, which has the strong surface dependency, is then discharged. A silicon containing insulating film 16 is then formed on the film-forming surfaces of the wafers being loaded on four film forming portions (B to E portions) by the chemical vapor deposition. Film forming conditions employed in this case are given in above Table 2 (the item of the film forming portions B, C, D, E).

Examination results concerning the situations of the circular defect generated after the film formation are given in Table 3.

TABLE 3

Occurrence of Circular Defect

| Item | Process time (sec) | $O_3$ concentration (g/Nm$^3$) | Occurrence of Circular Defect (l/wafer) |
|---|---|---|---|
| unprocessed | 0 | 0 | 5.13 |
| $N_2$ process | 30 | 0 | 2.75 |
|  | 60 | 0 | 2.75 |
|  | 90 | 0 | 2.25 |
| $O_3$ process | 30 | 100 | 3.0 |
|  | 60 | 100 | 2.0 |
|  | 90 | 100 | 0.5 |

As the examination sample, while using an Si wafer having a diameter of 8 inch (200 mm), the substrate on which the film is formed after executing the cleaning process under the conditions given in Table 2 (in the case of the $O_3$ concentration of 100 g/Nm$^3$ given in the item of the cleaning portion A) (labeled as the "$O_3$ process" in Table 3) is employed. For the sake of comparison, both the substrate on which the film is formed after executing the cleaning process by using the $N_2$ (the heating temperature is set identically to that in the $O_3$ process) under the same conditions as above (labeled as the "$N_2$ process" in Table 3) and the substrate on which the film is formed after executing no pre-process under the same conditions as above (labeled as the "unprocessed" in Table 3) are also employed as the examination samples. In both the $O_3$ process and the $N_2$ process, the process time is changed into three types of 30, 60, 90 sec.

According to the results shown in Table 3, it has been confirmed that, in the case of the $N_2$ process which does not contain $O_3$, the occurrence of the circular defect can be kept constant regardless of the process time and thus the number of the circular defect can be halved rather than the unprocessed case, and as a result a certain effect can be achieved. On the contrary, in the cases of the $O_3$ process, the number of the circular defect is reduced as the progress of the process time, the number is reduced to 1/10 the unprocessed case at the process time of 90 sec and also reduced to about 1/5 the $N_2$ process case. It has been found that the $O_3$ process is most effective.

In addition, a distinctive feature residing in the case of the $O_3$ process is that the diameter of the circular defect can be reduced remarkably. That is, it has been found that, in the unprocessed case, the average diameter of the circular defect is about 5 mm. In contrast, it has been found that, if the $O_3$ process is carried out for 90 sec, the average diameter of the circular defect is reduced to less than 1 mm, and also the number of the circular delect whose diameter exceeds 5 mm merely occupies 11% of the total defect number.

From the above, it may be supposed that the chlorate film which is melted and then spread is decomposed due to the dissociation under the presence of $O_3$ and then escaped from the surface of the substrate. In this case, if it can be assumed that mainly the chlorine is escaped, the remaining potassium oxide is not thermally stable and thus is escaped easily from the film-forming surface since the potassium oxide has the decomposition point of 350° C. and such decomposition point is lower than the film forming temperature (400° C. to 500° C.).

Accordingly, it is possible to say that the surface cleaning method according to the embodiment of the present invention is extremely effective for preventing the disturbance in film formation of the High $O_3$/TEOS-CVDSiO$_2$ film depending upon the surface contamination of the alkali salt.

With the above, the present invention has been explained in detail along the embodiment, but the scope of the present invention is not limited to the above embodiment being particularly discussed. Variations of the above embodiment are contained in the scope of the present invention without departing the gist of the present invention.

Figure 3B:
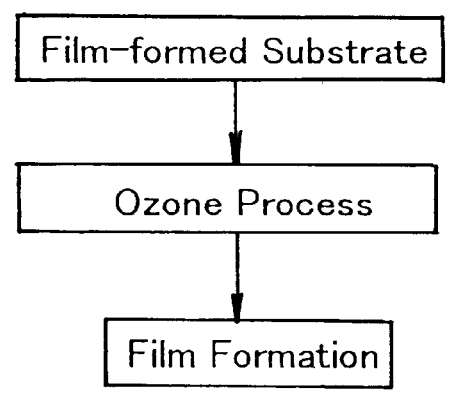
FIG. 3B is a flowchart showing another semiconductor device manufacturing method using another film-forming surface cleaning method according to the embodiment of the present invention.

For instance, although both the ion irradiation process and the ozone process have been performed as the pre-process for the substrate surface in the above embodiment, at least the ozone process should be performed, as shown in FIG. 3B.

In addition, the gas mixture consisting of the oxygen containing ozone and the nitrogen has been employed as the ozone containing gas 15. But the ozone containing gas 15 is not limited to such gas mixture, and other ozone containing gases may be employed.

Otherwise, the ozone not-containing but oxygen containing gas, as the case may be employed as the pre-process gas. In this case, reactivity in the oxidation reaction may be enhanced by the substrate heating or the plasmanization of the pre-process gas.

Although preferably the substrate heating temperature in the pre-process is set to more than 400° C., it is not limited to such temperature and the substrate heating temperature in the pre-process may be selected arbitrarily according to material of the particles. In other words, any substrate heating temperature may be selected if it exceeds the decomposition point of the particle oxide 13a.

In addition, although the present invention is applied to the case where the surface 12 of the substrate 11 is formed of the silicon surface, the present invention is not limited to such case. The present invention may be applied to the case where the insulating film such as the oxide film, the nitride film, etc. is exposed on the surface 12, the case where the conductive film such as the wiring, etc. is exposed, or the case where both the insulating film and the conductive film are exposed.

In addition, although the gas mixture of the gas containing the ozone in the oxygen and the gas containing TEOS is employed as the film forming gas, such film forming gas is not limited to this. A gas mixture of consisting of the gas containing the ozone in the oxygen and trimethoxysilane (TMS: $(CH_3O)_3SiH$), hexamethyldisilazane (HMDS), hexamethyldisiloxane (HMDSO), or the like may be employed as the film forming gas.

Further, although the present invention is applied to the case where the particles 13 are formed of the alkaline metal salt, the present invention is not limited to such case. The present invention may be applied to the case where the particles 13 before the pre-process are formed of alkaline earth metal salt, e.g., alkaline earth metal chloride ($MgCl_2$, $CaCl_2$, etc.). For example, $CaCl_2$ has the high decomposition point (in this case, which is equivalent to about 1935° C. as the boiling point) and is stable, but it produces unstable calcium chlorate ($Ca(ClO_3)_2$) when oxidized by the pre-process. Thus, the decomposition point of ($Ca(ClO_3)_2$) is lowered to about 340° C. which is equivalent to the melting point.

Further, the ozone concentration in the pre-process gas is set to 100 g/Nm$^3$ in the above embodiment, but the present invention is not limited to such value. It is preferable that such ozone concentration should be set to more than 10 g/Nm³, if possible, in order to have a sufficient oxidizing force.

Furthermore, the present invention is applied to the pre-process for the substrate surface prior to the formation of the insulating film, but the present invention is not limited to such pre-process. The present invention may be applied to the pre-process for the substrate surface prior to the formation of the conductive film, the pre-process for ion-implantation, and the preprocess for the substrate surface before other steps are carried out.

As described above, according to the present invention, when the particles are stuck onto the surface of the substrate, the oxidized particle is generated by exposing the surface to the ozone containing gas end is then heated at the temperature in excess of the decomposition point of the particle oxide. Therefore, the particles can be effectively removed and also the surface, of the substrate can be cleaned.

Moreover, if the film is formed on the cleaned surface of the substrate by the chemical vapor deposition using the film forming gas like the gas mixture consisting of the ozone containing gas and the silicon containing gas, which is affected strongly by the surface dependency, such surface dependency in forming the film can be eliminated and thus the silicon containing insulating film can be formed normally.

What is claimed is:

1. A method of cleaning a surface of a substrate on which particles are present comprising the steps of:

oxidizing said particles by contacting a pre-process gas containing ozone to said surface of the substrate; and removing said particles by heating said substrate to exceed a decomposition point of oxide of the particles.

2. The method of cleaning a surface of a substrate according to claim 1, wherein charges on said surface of the substrate and the particles are eliminated by contacting positive and negative ions to said surface of the substrate before contacting said pre-process gas containing the ozone to said surface of the substrate.

3. The method of cleaning a surface of a substrate according to claim 1, wherein said particles are formed of alkaline metal salt.

4. The method of cleaning a surface of a substrate according to claim 3, wherein said alkaline metal salt is composed of chloride of sodium or chloride of potassium.

5. The method of cleaning a surface of a substrate according to claim 1, wherein said particles are formed of alkaline earth metal salt.

6. The method of cleaning a surface of a substrate according to claim 5, wherein said alkaline earth metal salt is composed of chloride of magnesium or chloride of calcium.

7. The method of cleaning a surface of a substrate according to claim 1, wherein the heating temperature of said substrate is set to more than 400° C.

8. The method of cleaning a surface of a substrate according to claim 1, wherein said pre-process gas containing the ozone is composed of a gas mixture consisting of oxygen, ozone, and nitrogen.

9. The method of cleaning a surface of a substrate according to claim 1, wherein an ozone concentration in said pre-process gas containing the ozone is seat to 10 g/m³ (0° C., 1 atmospheric pressure).

10. The method of cleaning a surface of a substrate according to claim 1, wherein silicon is exposed on said surface of the substrate.

11. A method of manufacturing a semiconductor device comprising the steps of:

contacting a pre-process gas containing ozone to a surface of a substrate on which particles are present, thereby oxidizing said particles;

removing said particles by heating said substrate to exceed a decomposition point of oxide of said particles; and forming a silicon containing insulating film on said surface of the substrate by a chemical vapor deposition using a film forming gas which contains an ozone containing gas and a silicon containing gas.

12. A semiconductor device manufacturing method according to claim 11, wherein said ozone containing gas is composed of a gas which contains ozone in oxygen, and said silicon containing gas is composed of a gas which contains at least one of tetraethylorthosilicate (TEOS), trimethoxysilane (TMS), hexamethyldisilazane (HMDS), and hexamethyldisiloxane (HMDSO).

* * * * *

UNITED STATES PATENT AND TRADEMARK OFFICE
CERTIFICATE OF CORRECTION

PATENT NO. : 6,124,210
DATED : September 26, 2000
INVENTOR(S) : Chino et al.

It is certified that error appears in the above-identified patent and that said Letters Patent is hereby corrected as shown below:

Title page,
Under the Heading, "References Cited", "5,674,357 10/1997" should read
-- 5,674,357 11/1999 --.

Column 1,
Line 36, "if as" should read -- if, as --.

Column 3,
Between lines 2 and 3, insert the following two paragraphs:
-- FIGS. 4A to 4C are sectional views showing a film-forming surface cleaning method according to the embodiment of the present invention in the order of steps; and
FIG. 5 is a top view showing a film forming equipment employed to carry out the film-forming surface cleaning method according to the embodiment of the present invention. --.

Column 5,
Line 49, "bag" should read -- by --.

Column 9,
Line 11, "preprocess" should read -- pre-process --; and
Line 19, "surface, of" should read -- surface of --.

Column 10,
Line 19, "seat" should read -- set --.

Signed and Sealed this

First Day of January, 2002

Attest:

Attesting Officer

JAMES E. ROGAN
Director of the United States Patent and Trademark Office